United States Patent [19]

Hulls et al.

[11] 4,032,852
[45] June 28, 1977

[54] FILTER WHICH TRACKS CHANGING FREQUENCY OF INPUT SIGNAL

[75] Inventors: Leonard Robin Hulls, Marblehead; Stephen Clow Hadden, Cambridge, both of Mass.

[73] Assignee: RCA Corporation, New York, N.Y.

[22] Filed: Jan. 2, 1976

[21] Appl. No.: 646,389

[52] U.S. Cl. .............................. 328/167; 328/160; 328/127

[51] Int. Cl.² ......................................... H03B 1/04

[58] Field of Search .......... 328/167, 127, 155, 160; 307/233

[56] References Cited

UNITED STATES PATENTS

| | | | |
|---|---|---|---|
| 3,696,252 | 10/1972 | Chapman ........................ | 307/233 |
| 3,805,173 | 4/1974 | Nakamura et al. ................ | 328/155 |
| 3,835,399 | 9/1974 | Holmes ............................. | 328/167 |
| 3,919,648 | 11/1975 | Uetrecht ........................... | 328/167 |

*Primary Examiner*—John S. Heyman
*Attorney, Agent, or Firm*—Carl V. Olson; H. Christoffersen; S. Cohen

[57] ABSTRACT

A signal-frequency tracking band-pass filter useful for passing an input signal which changes rapidly in frequency. The tracking filter includes a voltage-controlled band pass filter, and a frequency-to-voltage converter for translating the output frequency of the filter to a voltage for controlling the pass band center frequency of the filter. The Q of the filter is controlled by a feedback circuit which makes the Q vary inversely with output signal amplitude. The Q is high for weak signals that are hard to lock on to, and the Q is low for strong signals to facilitate tracking of signals which change rapidly in frequency. The filter is especially useful for inclusion in internal combustion engine diagnostic equipment.

4 Claims, 5 Drawing Figures

FILTER WHICH TRACKS CHANGING FREQUENCY OF INPUT SIGNAL

BACKGROUND OF THE INVENTION

Tracking filters are known which have a frequency pass band that tracks or follows the changing frequency of a signal applied to the input of the filter. Such tracking filters include an acitive filter and feedback means to control the frequency pass band of the filter in accordance with the frequency of the output signal from the filter. Known tracking filters are limited in their ability to track a noisy input signal which changes rapidly in frequency and which changes in frequency over a large range.

A tracking band-pass filter capable of tracking an input signal having a rapidly changing frequency is described in a patent application Ser. No. 573,034 filed on Apr. 30, 1975, for "Filter Which Tracks Changing Frequency of Input Signal." The application, by Eldon M. Sutphin, Jr., matured into U.S. Pat. No. 3,978,416 on Aug. 31, 1976. The tracking filter includes an active voltage-controlled filter having a frequency control terminal. The output sine wave signal from the filter is translated to a pulse wave which is applied to a frequency-to-voltage converter. The time period between successive pulses is measured by digital means to provide a period-representing voltage which is then inverted to provide a frequency-representing voltage. The frequency-representing voltage is obtained very quickly in the period of one cycle of the signal passed by the filter, and is applied to the frequency control terminal of the filter.

SUMMARY OF THE INVENTION

An improved tracking filter is provided by incorporating a variable-Q feedback circuit in the voltage-controlled filter. The circuit responds to the amplitude of the signal passed by the filter and causes the Q of the filter to vary in an inverse fashion. By this means, the tracking filter has a low Q needed for tracking an input signal which changes very rapidly in frequency, and the tracking filter has a high Q as needed to lock on to and track a low amplitude input signal.

DESCRIPTION OF THE PREFERRED EMBODIMENT

Figure 1:
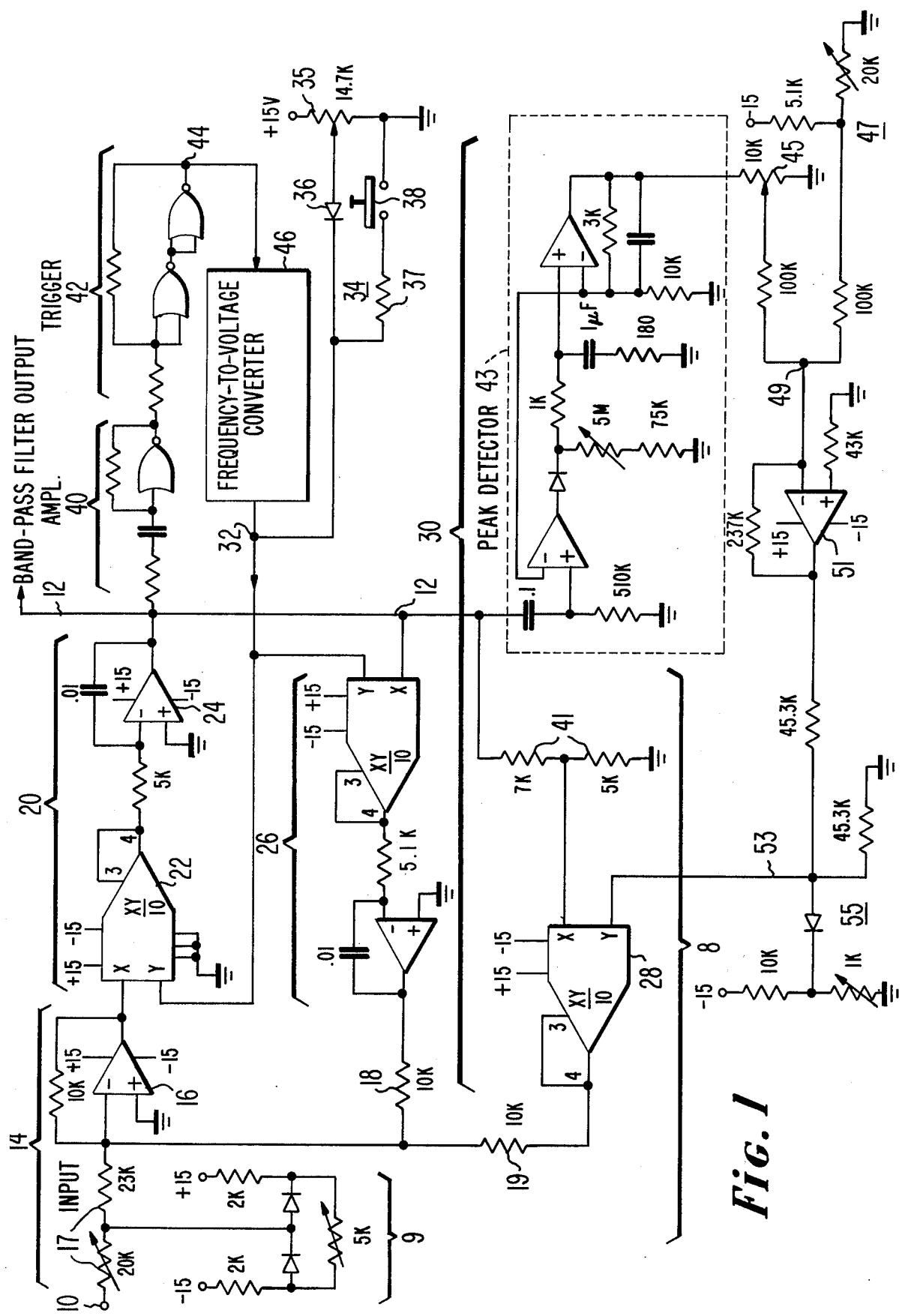
FIG. 1 is a system diagram of a tracking filter constructed according to the teachings of the invention.

Reference is now made in greater detail to the tracking filter of FIG. 1. The tracking filter includes a voltage-controlled filter 8 having a signal input terminal 10 and a signal output terminal 12. The input terminal 10 is connected through an input signal clamp and gain adjusting circuit 9 to a summation amplifier 14 consisting of an operational amplifier 16 connected as an inverting gain amplifier having summation input resistors 1 7, 18, and 19. Inverting gain amplifiers are described at page 172 of "Operational Amplifiers-Design and Applications" edited by Tobey, Graeme and Huelsman and published by McGraw-Hill in 1971. The operational amplifier 16, and other operational amplifiers in FIG. 1 may be constituted by one-half of a Motorola MC1458 operational amplifier unit.

The output of summation amplifier 14 is connected to an input X of a voltage-controlled integrator 20 including a multiplier 22, and an operational amplifier 24 connected as an integrator in a manner described at page 212 of the above-mentioned book. The multiplier 22 may be a Type AD532 manufactured by Analog Devices, and may be any multiplier described in pages 268–281 of the above-mentioned book. The output 12 of the integrator is connected in a positive feedback path consisting of a voltage-controlled integrator 26 like integrator 20 and in a parallel negative feedback path consisting of a multiplier 28 connected in a variable-Q feedback circuit 30.

The Y inputs of the multipliers in voltage-controlled integrators 20 and 26 are connected to a frequency control terminal 32 to which a control voltage is supplied to control the pass band center frequency of the voltage-controlled filter 8. The control voltage is initially provided by a circuit 34 at a low value to cause the filter to have a low frequency pass band and to provide initial lock. The circuit 34 provides a low voltage at 32 by current flowing from the +15v terminal through potentiometer 35, diode 36, resistor 37 and switch 38. Of the frequency of the input signal applied to terminal 10 increases, a higher control voltage is supplied to terminal 32 by the action of a class A amplifier 40, a trigger circuit with hysteresis or limiting amplifier 42 producing a square wave at 44, and a frequency-to-voltage converter 46. The amplifier elements may be contained in RCA CD4001AE integrated circuit units.

The variable-Q feedback circuit 30 in FIG. 1 incldues a feedback path from filter output line 12 through a voltage divider 41, the multiplier 28 and the summation resistor 19 to the input of summation amplifier 16. This feedback path determines the Q of the voltage-controlled filter 8. The Q remains constant so long as a constant voltage is applied to the Y input of multiplier 28. The Q of the filter is made to vary inversely with signal amplitude by a varying voltage applied to the Y input of multiplier 28.

A portion of the signal at the output 12 of the voltage-controlled filter 8 is applied to a peak detector 43, which may be constructed as shown using two operational amplifiers on a Motorola MC1458 integrated circuit unit. The peak detector 43 produces a d-c voltage across potentiometer 45 which varies in the same direction as the amplitude of the input signal at 10 and the output signal at 12 of the filter. A negative reference voltage from source 47 is summed with the varying positive voltage at potentiometer 45 at summing junction 49, and the sum is applied through an inverting amplifier 51 and over lead 53 as a negative voltage to the Y input of multiplier 28. A clamp circuit 55 prevents the negative d-c voltage on 53 from rising to zero volts, which would tend to cause an infinite Q and undesired oscillations.

Figure 3:
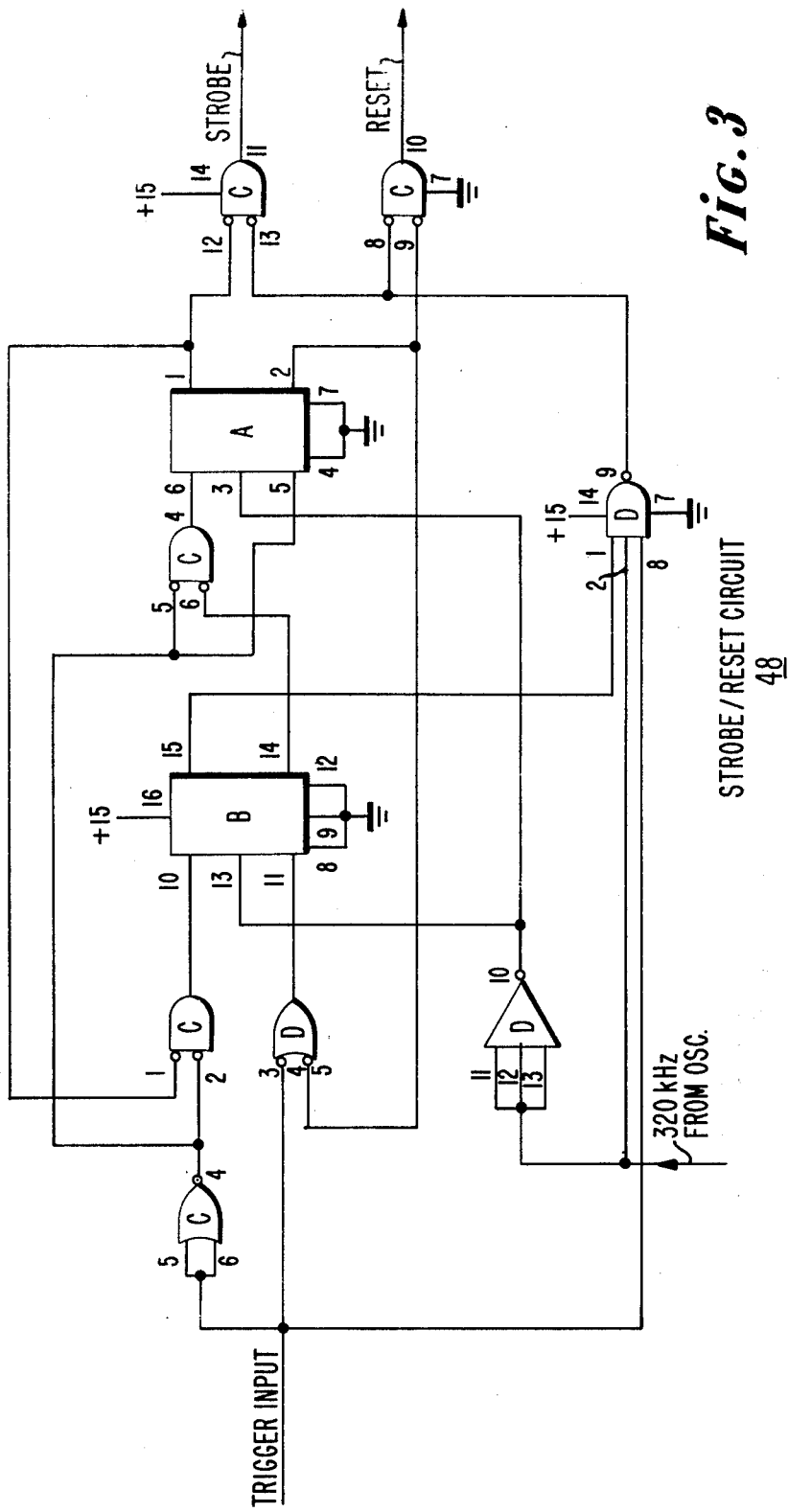
FIG. 3 is a circuit diagram of a strobe/reset circuit included ih the block diagram of FIG. 2.
Figure 4:
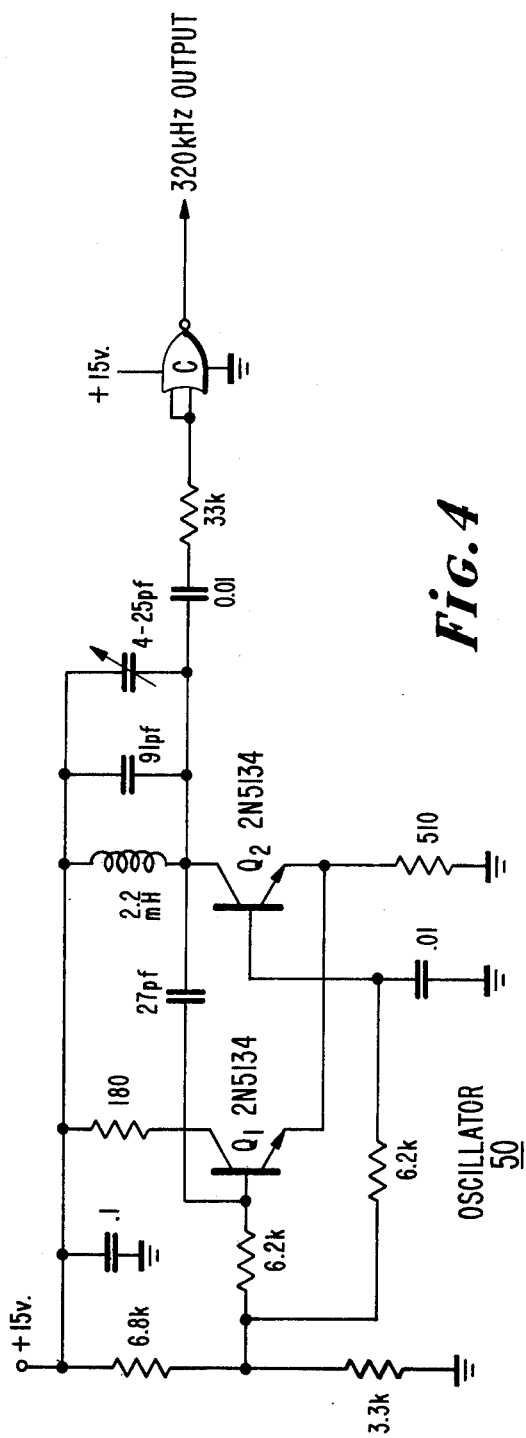
FIG. 4 is a circuit diagram of an oscillator included in the block diagram of FIG. 2.

The a-c signal at the X input of multiplier 28 is multiplied by the negative d-c signal at the Y input of the multiplier, and the product at the output of the multiplier is 180° out of phase with the X input to the multiplier and the output 12 of the tracking filter. The amplitude of the inverted output from the multiplier 28 increases as the Y input to the multiplier becomes increasingly negative as the result of an increasingly high amplitude output from the tracking filter. To summarize, an increased signal amplitude at 12 from the tracking filter causes an increased amplitude signal with a 180° phase reversal from the multiplier 28, and this negative feedback to the summing amplifier 16 causes a reduction in the amplification of the input signal at 10, with the result of that the Q of the filter is reduced. Increased signal amplitude causes reduced Q. Conversely, reduced signal amplitude causes increased Q. The total transfer function of the tracking filter shown in FIG. 1 is:

$$H_{(s)} = \frac{\frac{KVS}{10RCQ}}{S^2 + \frac{VS}{10RCQ} + \left(\frac{V}{10RC}\right)^2}$$

where: $S$ = LaPlace operator $Q = \frac{\text{Center frequency}}{\text{Bandwidth}}$ $K$ = Gain at center frequency $RC = \frac{1}{\text{Natural frequency}}$ $V$ = Control voltage The frequency-to-voltage converter 46 in FIG. 1 is shown in detail in FIG. 2. The input 44 of the converter is connected to a strobe/reset circuit 48 which also receives a 320 KHz square wave from an oscillator 50. The circuit 48 produces a strobe output pulse at 52, and shortly thereafter a reset output pulse at 54. The strobe and reset pulses occur once per cycle of the trigger input, which may have a repetition rate of a few hundred pulses or cycles per second. The stroke and reset pulses each have the duration of a half cycle of the square wave from the 320 KHz oscillator. The strobe/reset circuit may have a detailed circuit diagram as shown in FIG. 3, wehre JK flip-flops A and B are an RCA CD4027AE unit, gates C are an RCA CD4001AE unit and gates D are an RCA CD4023AE unit. The oscillator 50 may have a detailed circuit diagram as shown in FIG. 4.

Figure 2:
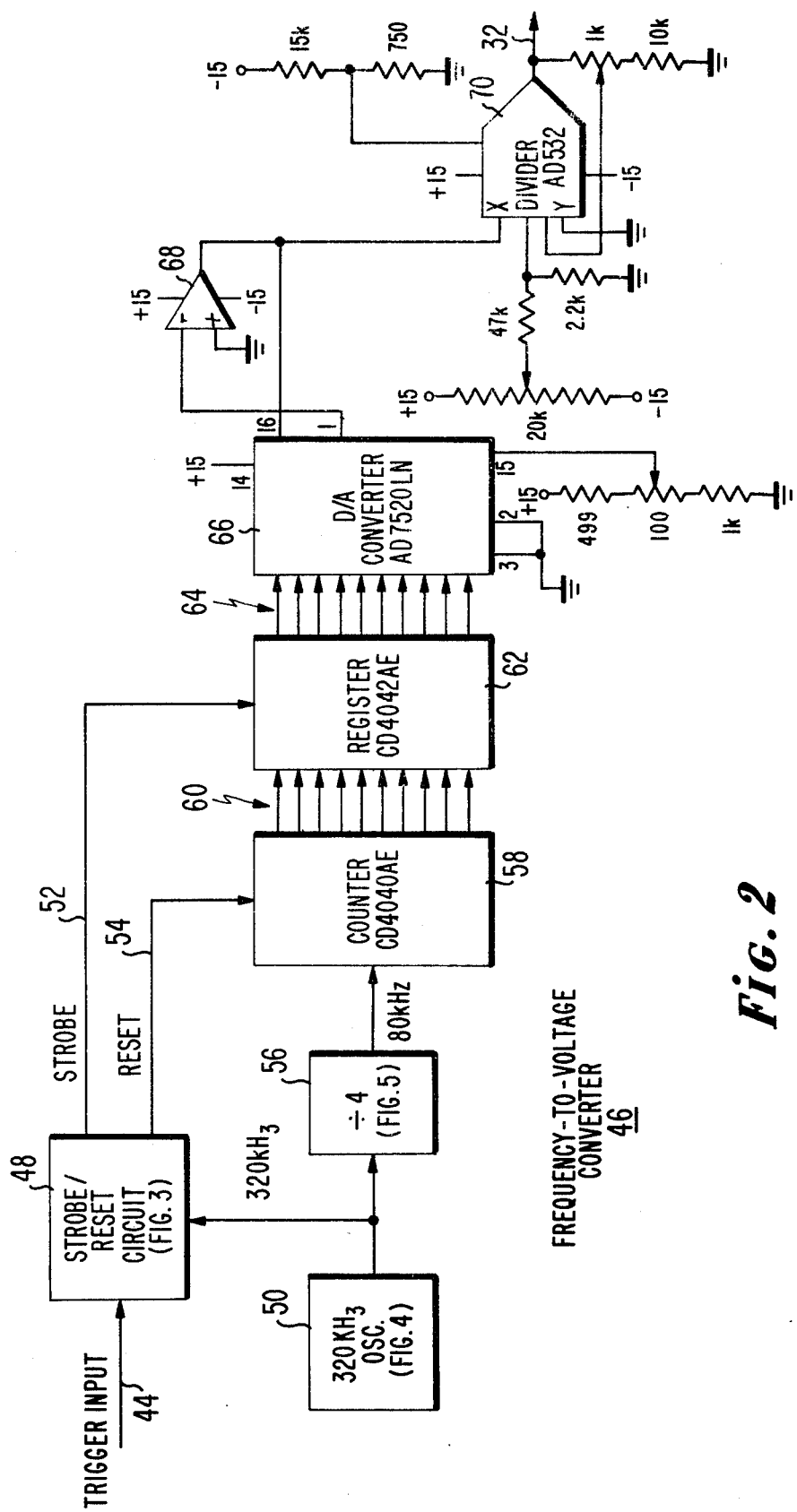
FIG. 2 is a block diagram of a frequency-to-voltage converter included in the system of FIG. 1.
Figure 5:
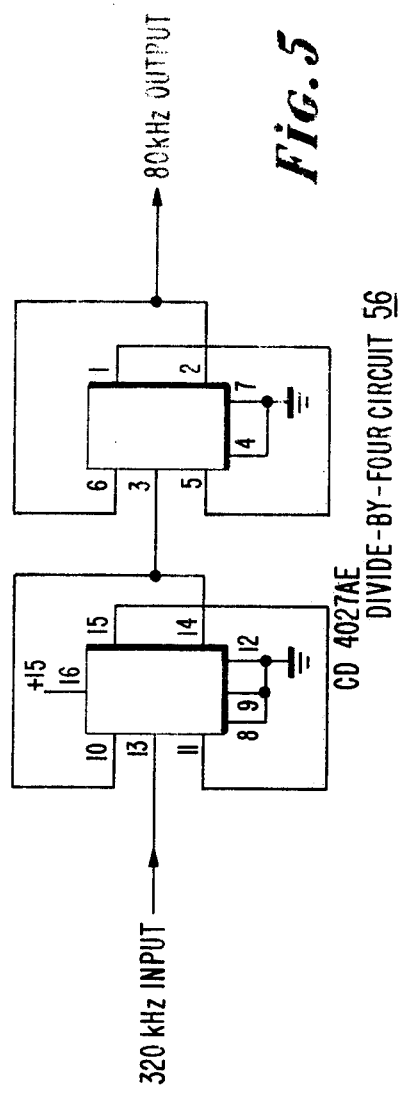
FIG. 5 is a circuit diagram of a divde-by-four circuit included in the block diagram of FIG. 2.

The frequency-to-voltage converter of FIG. 2 includes a divide-by-four circuit 56 which divides the 320 KHz square wave from oscillator 50 to an 80 KHz pulse wave which is applied to the input of a counter 58. The divider 56 may be constituted by an RCA CD4027AE unit wired as shown in FIG. 5.

The counter 58 counts the 80 KHz input pulses until it is reset by a reset pulse over line 54 from circuit 48. The counter, which may be an RCA CD4040AE integrated circuit unit, has ten output lines 60 over which the count is transferred to a storage register 62 when the register is gated by a strobe pulse over line 52 from the circuit 48. The register 62 may consist of three RCA CD4042AE integrated circuit units. The register 62 has ten output lines 64 connected to ten inputs of a digital-to-analog converter 66 such as the Analog Devices AD7520LN integrated circuit unit. The analog output of the converter 66 is applied through an operational amplifier 68 to the X input divider 70 such as the Intronics Inc. D210 unit, or the Analog Devices AD532 unit where the reciprocal is taken. The output at 32 from the divider is a control voltage which varies linearly with the frequency or repetition rate of the trigger wave applied at 44 to the input of the frequency-to-voltage converter.

OPERATION OF FIG. 2

The trigger input at 44 is a pulse wave having a frequency equal to the center frequency passed by the tracking filter of FIG. 1. The time period between two successive pulses of the trigger pulse wave is measured by counting in counter 58 and storing in register 62. The number of cycles of the 80 KHz wave which occur between the two successive pulses. The stored digital count is translated in digital-to-analog converter 66 to a corresponding time-representing voltage having an amplitiude in accordance with the period of the trigger pulse wave. The divider or inverter 70 translates the time-representing voltage to a corresponding frequency-representing voltage corresponding with the frequency of the input trigger wave. The frequency-representing voltage is obtained during a single period of the trigger wave, in contrast to prior art arrangements which require a sensing of a large number of periods of a wave in order to determine its frequency, or measuring less than each successive period. The frequency-representing voltage output at 32 changes without delay as the frequency of the trigger pulse wave changes.

OPERATION OF FIG. 1

The tracking filter in FIG. 1 includes a voltage-controlled filter having a signal input terminal 10, a signal output terminal 12 and a frequency control terminal 32 to which a control voltage is applied to control the frequency pass band of the filter. A suitable minimum control voltage is applied to terminal 32 from initializing circuit 34 to make the frequency pass band of the filter encompass the frequency of a minimum-frequency input signal, being applied to input terminal 10, which it is desired to lock on to or track. This is accomplished by closing the switch 38 while the potentiometer 35 is at an appropriate setting. The frequency-to-voltage converter 46 is also adjusted to supply the same minimum control voltage to the terminal 32. When the switch 38 is opened, the control voltage applied to control terminal 32 is solely determined by the feedback loop including amplifier 40, trigger 42 and frequency-to-voltage converter 46.

If the frequency of the signal applied to input terminal 10, and passed to output terminal 12, increases slightly, the control voltage produced by amplifier 40, trigger 42 and converter 46 also increases slightly and causes the pass band frequency of the filter to increase a corresponding amount, without delay. Whenever the frequency of the input signal changes, the frequency pass band of the filter immediately changes to track the changing frequency of the input signal. The tracking filter is capable of responding very rapidly to a rapid change of input signal frequency because of the digital techniques employed in the frequency-to-voltage converter 46 to measure the period of each and every cycle of the signal from the filter and to then generate corresponding frequency-representing correction voltages for the voltage-controlled filter.

The variable Q feedback circuit 30 permits the tracking filter to lock in on, and track the frequency of, a low-amplitude input signal by causing the tracking filter to have a high Q which rejects disturbing nearby frequency components. The low amplitude signal and need for a high Q filter exist in an application of the invention to diagnostic equipment for internal combustion engines. Such a diagnostic system is described in a copending patent application Ser. No. 573,032 filed on Apr. 30, 1975, by Hadden et al. and entitled "Tachometer Without Physical Connection to Internal Combustion Engine," and in patent application Ser. No. 646,388 filed concurrently herewith by Hulls and Hadden, and entitled "Engine Diagnosis From Frequency Components in Exhaust." The a-c signal frequency representing the rate of cylinder explosions in an engine during an initial idleing condition is of low amplitude in the presence of other nearby frequency components. The invention desireably causes the filter to have a high Q under these conditions.

When the engine is rapidly accelerating during an accelerator burst test, the a-c signal has a high amplitude, and the frequency of the a-c signal changes very rapidly. Under these conditions, the Q of the tracking filter should be so low that the filter can track the changing frequency. Otherwise the output frequency might get outside the pass band of the filter before the frequency-controlling feedback voltage changed the pass band frequency in a direction to include the new frequency. The invention desirably causes the filter to have a low Q under these conditions.

What is claimed is:

1. A band-pass filter having a frequency pass band which tracks the changing frequency of an input signal, comprising
    a voltage-controlled filter including a signal input terminal, a signal output terminal and a frequency control terminal,
    a frequency-to-voltage converter coupled from said signal output terminal to said frequency control terminal to cause the pass band frequency of the filter to track the frequency of the input terminal signal, and
    means coupled from said signal output terminal to said signal input terminal to cause the Q of the filter to vary in an inverse relation with the amplitude of the input signal.

2. A filter as defined in claim 1 wherein said voltage-controlled filter includes a first voltage-controlled integrator coupled from said input terminal to said signal output terminal, and a second voltage-controlled integrator and a variable Q circuit coupled in parallel feedback paths from said signal output terminal to said signal input terminal.

3. A filter as defined in claim 1 wherein said means to cause the Q of the filter to vary includes a peak detector having an input coupled to said signal output terminal, and a multiplier having one input coupled to said signal output terminal, and having a second input coupled to the output of said peak detector and having an output terminal coupled to said signal input terminal.

4. A filter as defined in claim 3 and in addition an inverting amplifier located in the coupling to the second input of said multiplier from the output of said peak detector.

* * * * *

UNITED STATES PATENT OFFICE
CERTIFICATE OF CORRECTION

PATENT NO. : 4032852
DATED : June 28, 1977
INVENTOR(S) : Leonard Robin Hulls, et al.

It is certified that error appears in the above-identified patent and that said Letters Patent are hereby corrected as shown below:

Col. 1, Line 9  "acitive" should be --active--;

Col. 1, Line 52 "ih" should be --in--;

Col. 1, Line 55 "divde" shoulde be --divide--;

Col. 3, Line 47 "wehre" should be --where--'

Col. 4, Line 2  after "input" insert --of an analog--;

Col. 4, Line 21 "amplitiude" should be --amplitude--;

Col. 5, Line 27 after "be", "so low" should be --low so--

Signed and Sealed this

Fourth Day of October 1977

[SEAL]

Attest:

RUTH C. MASON
Attesting Officer

LUTRELLE F. PARKER
Acting Commissioner of Patents and Trademarks